(12) United States Patent
Dunham et al.

(10) Patent No.: US 7,538,035 B2
(45) Date of Patent: May 26, 2009

(54) LAPPING OF GOLD PADS IN A LIQUID MEDIUM FOR WORK HARDENING THE SURFACE OF THE PADS

(75) Inventors: Ronald Dunham, San Jose, CA (US); Wolfgang Goubau, Santa Cruz, CA (US); Bhargav Patel, Newark, CA (US); Marvin Wong, Danville, CA (US); John Jaekoyun Yang, Newark, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 427 days.

(21) Appl. No.: 11/083,808

(22) Filed: Mar. 18, 2005

(65) Prior Publication Data

US 2006/0211247 A1 Sep. 21, 2006

(51) Int. Cl.
*H01L 21/44* (2006.01)

(52) U.S. Cl. .................. 438/686; 438/693; 438/692; 257/E21.304

(58) Field of Classification Search ................ 438/686; 257/E21.304
See application file for complete search history.

(56) References Cited

U.S. PATENT DOCUMENTS

| | | | | |
|---|---|---|---|---|
| 3,677,906 A * | 7/1972 | Wang | | 205/77 |
| 3,923,231 A * | 12/1975 | Catalano et al. | | 228/194 |
| 4,861,374 A * | 8/1989 | Eriksson | | 510/256 |
| 5,209,023 A | 5/1993 | Bizer | | 51/209 |
| 5,369,916 A * | 12/1994 | Jefferies et al. | | 451/532 |
| 5,683,791 A * | 11/1997 | Horiuchi et al. | | 428/210 |
| 5,958,794 A | 9/1999 | Bruxvoort et al. | | 438/692 |
| 6,290,736 B1 | 9/2001 | Evans | | 51/307 |
| 6,395,194 B1 | 5/2002 | Russell et al. | | 252/79.1 |
| 6,431,948 B1 | 8/2002 | Atoh | | 451/5 |
| 6,436,832 B1 * | 8/2002 | Ma et al. | | 438/692 |
| 6,527,622 B1 | 3/2003 | Brusic et al. | | 451/28 |
| 6,554,878 B1 * | 4/2003 | Dill et al. | | 51/308 |
| 6,730,592 B2 | 5/2004 | Vaartstra | | 438/633 |
| 7,264,991 B1 * | 9/2007 | Lin | | 438/106 |
| 2001/0008311 A1 * | 7/2001 | Harada et al. | | 257/758 |
| 2002/0039839 A1 * | 4/2002 | Thomas et al. | | 438/693 |
| 2002/0112884 A1 * | 8/2002 | Tanaka | | 174/262 |
| 2003/0040188 A1 * | 2/2003 | Hsu et al. | | 438/697 |
| 2003/0042621 A1 * | 3/2003 | Chen et al. | | 257/784 |
| 2004/0077295 A1 * | 4/2004 | Hellring et al. | | 451/41 |
| 2004/0132308 A1 * | 7/2004 | Obeng | | 438/692 |
| 2004/0245110 A1 * | 12/2004 | Tonami et al. | | 205/118 |
| 2005/0106872 A1 * | 5/2005 | Hong et al. | | 438/689 |
| 2005/0230261 A1 * | 10/2005 | Cohen et al. | | 205/118 |

FOREIGN PATENT DOCUMENTS

EP 764500 A1 * 3/1997

* cited by examiner

*Primary Examiner*—Marcos D. Pizarro
*Assistant Examiner*—Igwe U. Anya
(74) *Attorney, Agent, or Firm*—Patent Law Office of Larry Guernsey; Larry B. Guernsey

(57) ABSTRACT

A method for work hardening gold contact pads is disclosed. The method includes providing gold contact pads, providing lapping pads, and placing the lapping pads in contact with the gold contact pads to create a contact interface. A liquid medium is then applied to the contact interface while moving the lapping pads relative to the gold contact pads. The liquid medium is preferably a particulate-free pH neutral liquid, which makes water a good choice. Also disclosed is a gold pad having a work hardened surface.

13 Claims, 2 Drawing Sheets

LAPPING OF GOLD PADS IN A LIQUID MEDIUM FOR WORK HARDENING THE SURFACE OF THE PADS

BACKGROUND OF THE INVENTION

1. Field of the Invention

The present invention relates generally to fabrication of electronic components and particularly to lapping of gold contacts on wafers.

2. Description of the Prior Art

In the fabrication of integrated circuits, a semiconductor wafer typically requires numerous processing steps, including deposition, patterning, and etching. It is often desirable to achieve a pre-determined level of surface planarity and to minimize surface irregularities such as scratches and pits. In the formation of gold pads, to which electrical leads will be connected, such surface irregularities may affect the performance of the final device and/or create problems during subsequent processing steps.

Consequently, a typical process includes treatment of surface defects on the wafer surface by using a polishing pad in conjunction with slurry containing loose abrasive particles dispersed in a liquid. A problem with use of such slurries, however, is that the slurries generate a large number of particles from the surface being polished which must be removed and disposed of following wafer treatment. Additionally, the particles of slurry material, such as alumina, can become embedded in the gold pads during the polishing process. These particles can interfere with the solder-ball bonding of the electrical leads, and thus the overall performance can be seriously degraded. A second cleaning process may be required to rid the gold pad surfaces of these residual particles, which of course increases processing time, and reduces efficiency.

Additionally, during testing of electrical components, it is necessary to attach probe wires to the gold pads to supply power to various circuits or to make test measurements, or to connect them with other circuits or testing apparatus. Gold is known to be a very soft metal, and it is not unusual for the surface of the gold pads to become dented or gouged during the course of the testing. This of course disturbs the planarity of the pads and can cause irregularities in the surface finish which can degrade the contacts made with connections in the finished product. Gouging can lead to shorting between probe wires. This is shown in FIGS. 1A-1C (prior art).

In FIG. 1A, a gold pad 2 which has not been hardened includes an upper surface 4, which is approached by a contact probe 6. In FIG. 1B, the probe 6 contacts the upper surface 4, and presses into the upper surface due to the softness of the gold pad 2. In FIG. 1C, the contact probe 6 is removed, leaving a gouge 8 or dent in the upper surface 4 of the gold pad 2.

It is of course undesirable for the testing process to degrade performance of the completed component. It is therefore desirable to harden the surface of the gold contacts before connecting them with testing probes, so that the surface is not so easily damaged.

Thus there is a need for a method of lapping gold pads which does not involve the use of alumina slurry, and which hardens the surface of the gold pads to prevent damage.

SUMMARY OF THE INVENTION

A preferred embodiment of the present invention is a method for work hardening gold contact pads. The method includes providing the gold contact pads, providing lapping pads, and placing the lapping pads in contact with the gold contact pads to create a contact interface. A liquid medium is then applied to the contact interface while moving the lapping pads relative to the gold contact pads. Also disclosed is a gold pad having a work hardened surface.

It is an advantage of the present invention that the surface of gold contact pads are work hardened while the surface is being planarized.

It is a further advantage of the present invention that gold pad surfaces are not as easily damaged by contact with probe wires.

It is a still further advantage of the present invention that electrical shorts between probe wires are minimized.

It is another advantage of the present invention that alumina slurry is not used and thus embedded alumina particles in the gold contact pads are eliminated.

It is yet another advantage of the present invention that further processing steps to remove embedded alumina particles are not required.

It is a further advantage of the present invention that processing steps are simplified.

It is an additional advantage of the present invention that better bonding with solder-ball attachments can be achieved, thus producing better production yields.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

The present invention is a method for work hardening gold contact pads while applying water to the working surface, and work hardened gold pads produce by this method, which shall be represented by the element number 10.

Work-hardening is a well known technique that applies to most crystalline materials. Hardening results whenever a mechanical stress permanently dislocates atoms from their equilibrium positions.

Contact pads are used in electrical components, to make circuit connections between various leads or components. In order to make good electrical contact, the pads preferably have a smooth and planar surface. In order to prepare the pads, a lapping process is often used to smooth and planarize the upper surfaces of the contact pads. During the lapping process, mechanical stress is provided by the sheering force produced by the movement of the lapping pads relative to the contact pads. The maximum sheering force that can be generated is limited by the lubricating properties of the lapping medium. In a typical lapping process of the prior art, a slurry of small particulate matter is often used as an abrasive, with various disadvantages, as discussed above.

Gold is often used as the material in the contact pads, as it has excellent electrical conduction properties. It is also a very soft and malleable metal. As mentioned above, the maximum mechanical stress that can be generated is limited by the lubricating properties of the lapping medium. A liquid lapping medium will generally not support high sheer stresses that produces work hardening, and thus can be suitable only for very soft materials.

Figure 3:
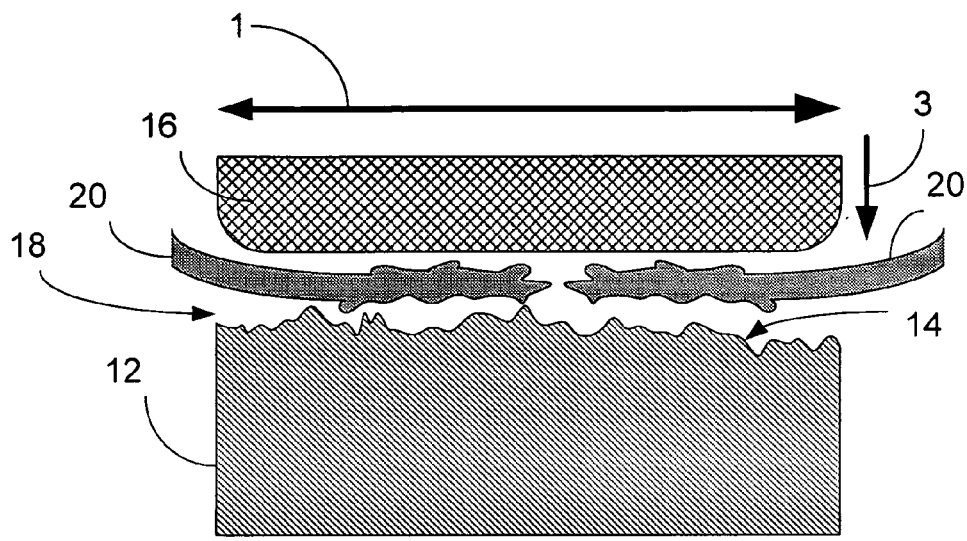
FIG. 3 shows the lapping of a gold pad in the presence of water, where the gold pad is held stationary and the lapping pad is moved on the gold pad.
Figure 4:
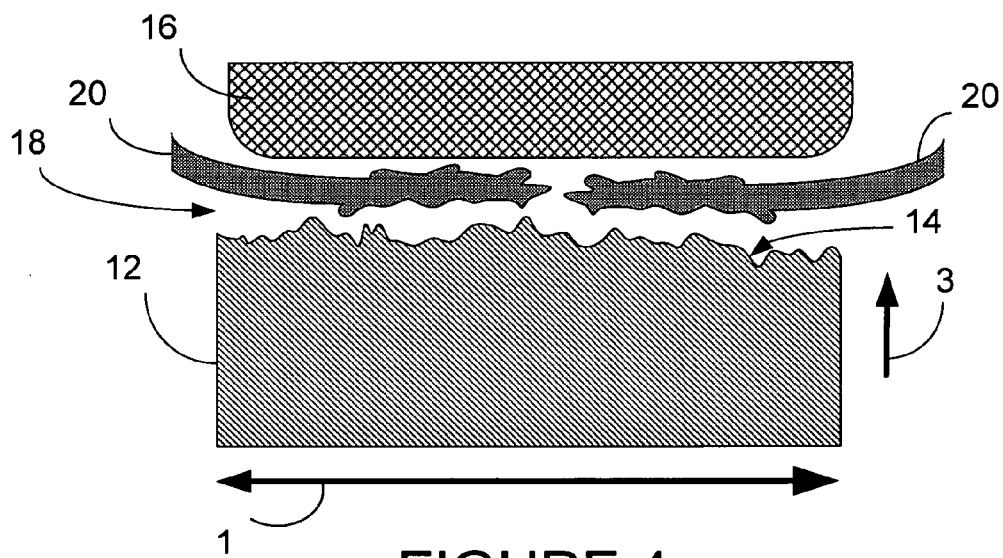
FIG. 4 shows the lapping of a gold pad in the presence of water, where the lapping pad is held stationary and the gold pad is moved.
Figure 5:
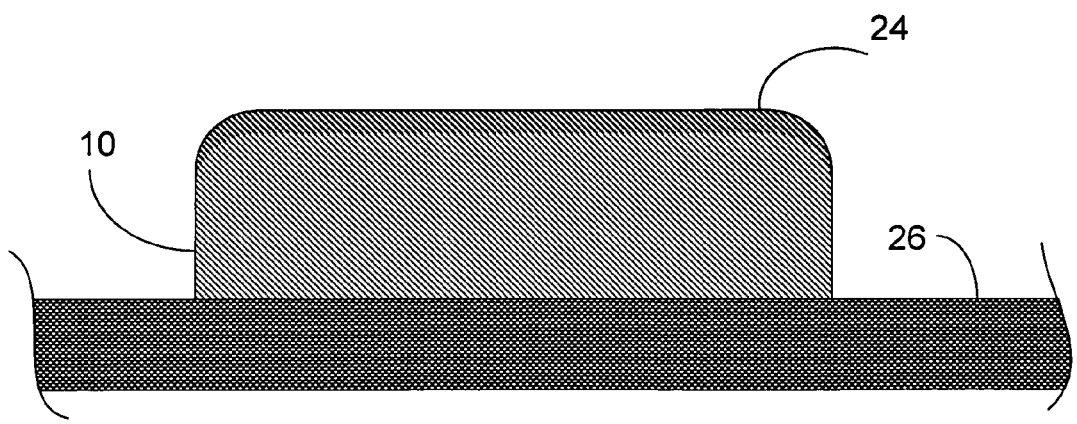
FIG. 5 shows the gold pad with work hardened surface as produced by the present invention.

FIGS. 3-5 show stages in the method of the present invention. FIG. 3 shows an untapped gold pad 12, having an upper surface 14 which is rough and not planarized. It is assumed that the untapped gold pad 12 is fixed in position while a lapping pad 16 is brought in contact with the upper surface 14 of the gold pad 12, to form a contact interface 18. Water 20 is introduced into the contact interface 18 as a liquid medium 22 in which to conduct the lapping process. The lapping pad 16 moves from side to side as indicated by the arrow 1, and some pressure is also applied in the vertical direction, as indicated by the direction arrow 3. The friction between the lapping pad 16 and the gold pad 12 creates sheering force, which smoothes the upper surface 14 of the gold pad 12. This also permanently dislocates atoms from their equilibrium positions in the crystalline structure of the gold pad 12. It thus work hardens the upper surface 14 to create the hardened surface 24 of the hardened gold pad 10 shown in FIG. 5. The substrate material 26 is also shown.

Figure 1A:
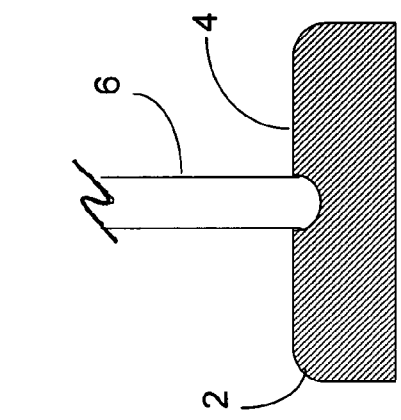
FIGS. 1A-1C show surface deformation to a gold pad by a probe in the process of the prior art.
Figure 1B:
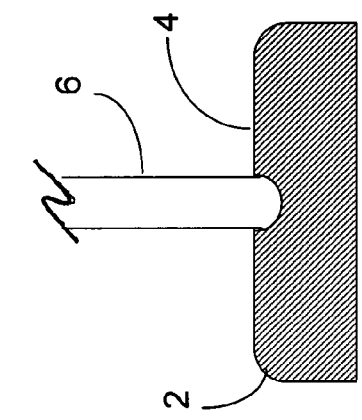
Figure 1C:
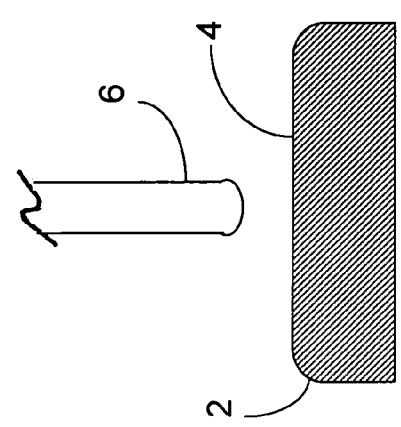
Figure 2A:
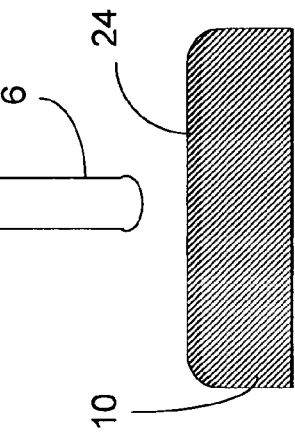
FIGS. 2A-2C show the lack of surface deformation by a probe to a work hardened gold pad as produced by the present invention.
Figure 2B:
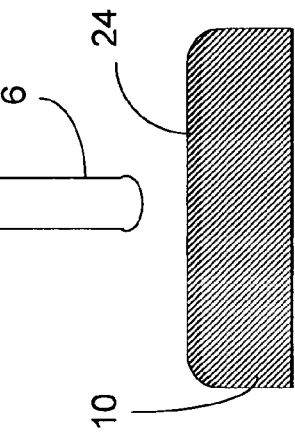
Figure 2C:
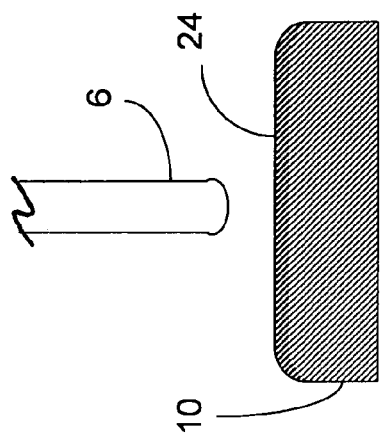

As shown in FIGS. 2A-2C, the hardened surface 24 of the hardened pad 10 is approached and contacted by a contact 6, and the hardened surface 24 is left with no gouges or dents. This is in contrast to the surface 4 of the unhardened gold pad 2 shown and discussed above in reference to FIGS. 1A-1C, which shows damage from gouges 8 and dents.

It is necessary to have relative motion between the gold pad 12 and the lapping pad 16, but, as shown in FIG. 4, this is also possible to produce by fixing the position of the lapping pad 16 and moving the gold pad 12, as shown by the arrow 1 while applying pressure, indicated by arrow 3.

Additionally, the relative motion between the gold pad 12 and the lapping pad 16 can be achieved when both the gold pad and the lapping pad are simultaneously moved.

As mentioned above water is a preferred liquid medium. This water is preferably free from impurities to some degree, and thus includes water that is distilled, de-ionized or otherwise purified.

It has also been found that liquid media other than water can be used, provided that they have suitable lubricating properties and that they do not produce unwanted chemical reactions. Gold pads 10 are substantially chemically inert but the substrate 26 (see FIG. 5) upon which the gold pads are built, typically alumina, tends to etch in both acidic (low pH) and basic (high pH) solutions. Thus a liquid with neutral pH (such as water) best prevents damage to the alumina substrate.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What is claimed is:

1. A method for work hardening gold contact pads without the use of slurry, comprising:
   A) providing a gold contact pad;
   B) providing a liquid medium which consists only of water;
   C) providing lapping pads; and
   D) lapping said gold contact pad with said lapping pads in the presence of said liquid medium which consists only of water to work harden said gold contact pad.

2. The method of claim 1, wherein:
   said liquid medium which consists only of water is distilled water.

3. The method of claim 1, wherein:
   said liquid medium which consists only of water is deionized water.

4. The method of claim 1, wherein:
   said liquid medium which consists only of water is purified water.

5. A method for work hardening gold contact pads without the use of slurry, comprising:
   A) providing a gold contact pad;
   B) providing a lapping pad;
   C) placing said lapping pad in contact with said gold contact pad to create a contact interface;
   D) applying liquid medium which consists only of water to said contact interface; and
   E) moving said lapping pad relative to said gold contact pad to work harden said gold contact pads.

6. The method of claim 5, wherein:
   said liquid medium which consists only of water is distilled water.

7. The method of claim 5, wherein:
   said liquid medium which consists only of water is deionized water.

8. The method of claim 5, wherein:
   said liquid medium which consists only of water is purified water.

9. The method of claim 5, wherein:
   said gold contact pad is held in fixed position, and said lapping pad is moved.

10. The method of claim 5, wherein:
    said lapping pad is held in fixed position, and said gold contact pad is moved.

11. The method of claim 5, wherein:
    both said lapping pad, and said gold contact pad are simultaneously moved.

12. A method for work hardening gold contact pads without the use of sluffy, comprising:
    A) providing a gold contact pad;
    B) providing a lapping pad;
    C) placing said lapping pad in contact with said gold contact pad to create a contact interface;
    D) applying liquid medium which is free of abrasives to said contact interface; and
    E) moving said lapping pad relative to said gold contact pad to work harden said gold contact pads.

13. The method of claim 12, wherein:
    said liquid medium is a pH neutral liquid.

* * * * *